United States Patent [19]

Hofmann et al.

[11] 4,145,622

[45] Mar. 20, 1979

[54] DECODER CIRCUIT ARRANGEMENT WITH MOS TRANSISTORS

[75] Inventors: Ruediger Hofmann, Munich; Paul-Werner von Basse, Wolfratshausen, both of Fed. Rep. of Germany

[73] Assignee: Siemens Aktiengesellschaft, Berlin & Munich, Fed. Rep. of Germany

[21] Appl. No.: 825,274

[22] Filed: Aug. 17, 1977

[30] Foreign Application Priority Data

Sep. 16, 1976 [DE] Fed. Rep. of Germany ....... 2641693

[51] Int. Cl.² .................... H03K 19/08; H03K 19/34; G11C 8/00; H03K 5/153
[52] U.S. Cl. .................................. 307/270; 307/205; 307/215; 307/DIG. 4; 307/DIG. 5; 365/230
[58] Field of Search ......... 307/205, 215, 270, DIG. 4, 307/DIG.5; 365/230, 231

[56] References Cited

U.S. PATENT DOCUMENTS

| | | | |
|---|---|---|---|
| 3,702,926 | 11/1972 | Picciano et al. | 307/205 X |
| 3,718,826 | 2/1973 | Donofrio et al. | 307/DIG. 5 X |
| 3,795,898 | 3/1974 | Mehta et al. | 307/DIG. 5 X |
| 3,959,781 | 5/1976 | Mehta et al. | 307/DIG. 5 X |
| 3,986,054 | 10/1976 | Hansen et al. | 307/DIG. 5 X |
| 3,995,171 | 11/1976 | Sonoda et al. | 307/DIG. 5 X |
| 4,001,601 | 1/1977 | Schuster | 307/DIG. 5 X |
| 4,011,549 | 3/1977 | Bormann | 307/DIG. 5 X |
| 4,027,174 | 5/1977 | Ogata | 307/DIG. 5 X |
| 4,048,629 | 9/1977 | Bormann | 307/DIG. 5 X |
| 4,063,118 | 12/1977 | Nishimura | 307/DIG. 5 X |

FOREIGN PATENT DOCUMENTS 2417972 10/1975 Fed. Rep. of Germany .... 307/DIG. 5

OTHER PUBLICATIONS

Remshardt et al., *IEEE Journal of Solid–State Circuits*, vol. SC-11, No. 3, pp. 352-358; Jun. 1976.
SIMI, "Field–Effect Transistor Drive Circuit"; IBM Tech. Discl. Bull.; vol. 17, No. 4, p. 1120; Sep. 1974.

*Primary Examiner*—Larry N. Anagnos
*Attorney, Agent, or Firm*—Hill, Gross, Simpson, Van Santen, Steadman, Chiara & Simpson

[57] ABSTRACT

A decoder circuit arrangement with MOS transistors includes a decoder circuit and an output stage. The output stage includes a driver transistor which emits a selection signal, in accordance with a decoder signal emitted from the decoder circuit, and includes a shunt transistor having a controlled path connected between the output of the decoder circuit and the output of the output stage and a control input which is supplied with the selection signal. An additional transistor has a controlled path connected between the output of the output stage and a fixed potential and a control input which is driven by a timing signal which renders the additional transistor conductive, at least during the time in which the selection signal is not present.

3 Claims, 2 Drawing Figures

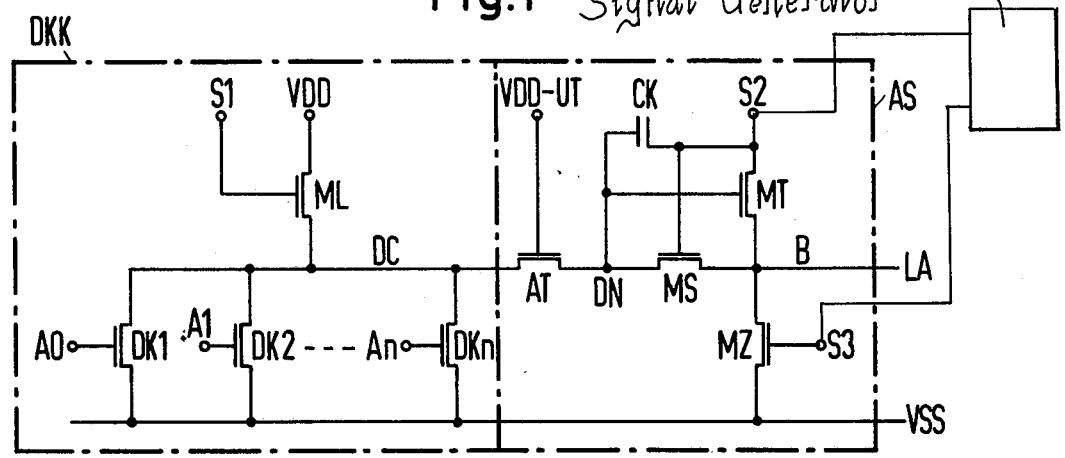
Fig.1 Selection and Timing Signal Generator
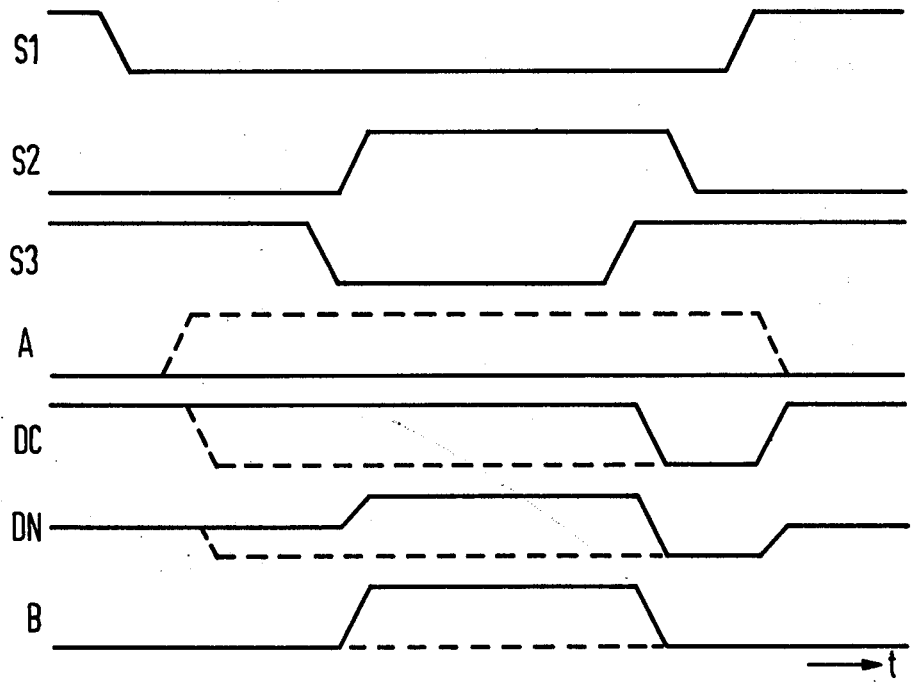
Fig.2

DECODER CIRCUIT ARRANGEMENT WITH MOS TRANSISTORS

BACKGROUND OF THE INVENTION

1. Field of the Invention

The present invention relates to a decoder circuit arrangement having MOS-transistors, including a decoder circuit and an output stage, wherein the output stage comprises a driver transistor, which emits a selection signal, corresponding to a decoder signal emitted from the decoder circuit, to the output of the output stage, and further comprises a shunt transistor, the controlled path of which is arranged between the output of the decoder circuit and the output of the output stage, and whose control input is supplied with the selection signal.

2. Description of the Prior Art

Decoder circuit arrangements provided with MOS transistors are required, in particular, in MOS storage modules. In storage modules of this type, storage cells are arranged between word lines and bit lines. In order to be able to select a storage cell in the storage module, it is therefore necessary to operate one word line and one bit line. This operation is effected with the aid of address signals which are supplied to the decoder circuits. In accordance with these address signals, a decoder circuit selects one of the lines. To this end a selection signal, the so-called module selection signal, is switched through to this line. This type of storage module only functions satisfactorily when the potential of the line connected to a decoder circuit is always fixed, irrespectively of whether this line has been selected or not. If a line has been selected, the potential of this line is determined by the selection signal. If, on the other hand, a line has not been selected, additional measures must be taken in order to connect the line to a potential. If this were not done, this line would be sensitive to interference resulting from leakage currents and capacitive over-couplings.

British Pat. Specification No. 1,375,958 has disclosed a circuit arrangement composed of MOS transistors, which operates dynamically. This decoder circuit arrangement can be split into a decoder circuit and an output stage. The decoder circuit comprises parallel-connected MOS transistors, whose control inputs are supplied with the address signals in the negated and unnegated form. The decoder circuit also comprises a pre-charge transistor which charges the output of the decoder circuit to a specific potential prior to the operation of the decoder circuit by address signals. The only time when the output of the decoder circuit is not discharged via the parallel-connected MOS transistors is when its assigned line is to be selected. In that case all the parallel-connected transistors, which in the following will be referred to as decoder transistors, remain blocked. The output stage contains at least one driver transistor by which the selection signal is switched to the output of the output stage, which output is connected to the bit line or word line. This is carried out in dependence upon the signal emitted from the output of the decoder circuit — the decoder signal. Thus, if the output of the decoder circuit is not discharged, the driver transistor of the output stage is rendered conductive, and any selection signal which occurs is switched through to the line at the output of the output stage. The potential on this line is then set accordingly. If, however, the output of the decoder circuit has been discharged via one of the decoder transistors, the driver transistor is blocked and any selection signal which occurs is not switched through to the line at the output of the output stage. The output stage also comprises a shunt transistor whose controlled path (source-drain path) lies between the output of the decoder circuit and the output of the output stage. The control input of the shunt transistor is also supplied with the selection signal. The shunt transistor is rendered conductive when the decoder circuit has been discharged via a decoder transistor or a plurality of decoder transistors and the selection signal is applied. Then the potential at the output of the decoder circuit is switched through to the line connected to the output of the output stage. This ensures that even those lines which have not been selected by the decoder circuit carry a specific potential during the presence of the selection signal, and are thus insensitive to any interferences. In the event that the decoder circuit is not discharged, i.e., all the decoder transistors remain blocked, when the selection signal is connected, the output of the output stage and the output of the decoder stage are accentuated via a coupling capacitor in such manner that the shunt transistor always remains blocked. In this manner the selected line which is connected to the output stage is fed via the driver transistor with a high potential which is not influenced by the shunt transistor. A disadvantage of this known decoder circuit, however, resides in the fact that the line which has not been selected is fixed in respect of potential only during the presence of the selection signal.

SUMMARY OF THE INVENTION

The object of the present invention is to provide a decoder circuit wherein the line connected to a decoder circuit is always fixed in respect of potential.

The above object is realized in that an additional transistor is provided whose controlled path is arranged between the output of the output stage and a fixed potential, and whose control input is driven by a timing signal which renders the additional transistor conductive at least during the time in which the selection signal is not present.

It is advantageous to connect this timing signal prior to the disconnection of the selection signal, in order to ensure that the non-selected line is always fixed in respect of potential.

BRIEF DESCRIPTION OF THE DRAWINGS

Other objects, features and advantages of the invention will be best understood from the following description taken in conjunction with the accompanying drawing, in which:

FIG. 1 is a schematic circuit diagram of a decoder constructed in accordance with the invention; and FIG. 2 is a pulse schedule (voltage with respect to time) for the operation of the decoder of FIG. 1.

DESCRIPTION OF THE PREFERRED EMBODIMENT

In FIG. 1 a decoder circuit arrangement is divided into a decoder circuit and an output stage. The decoder circuit is referenced DKK, and the output stage is referenced AS.

The decoder circuit DKK comprises decoder transistors DK1 to DKn, whose controlled paths are connected in parallel. The control inputs of these decoder transistors DK1 to DKn are supplied with the address signals AO to An. Also provided is a pre-charge transistor ML, which is operated by a timing signal S1 and which is connected to an operating voltage VDD.

Before the address signals AO to An are applied to the decoder transistors DK1 to DKn, the pre-charge transistor ML is rendered conductive by the timing signal S1. In this manner, the output DC of the decoder circuit is pre-charged to approximately the potential VDD - UT, where UT is the threshold voltage of the precharge transistor ML. In dependence upon the address signals A connected to the decoder transistors DK, the output DC of the decoder circiut DKK is either discharged or is not discharged. If a line connected to the decoder circuit arrangement is to be selected, the output DC of the decoder circuit is not discharged.

The output stage As comprises a driver transistor MT which is supplied with the output signal of the decoder circuit DKK via a cut-off transistor AT. If the output of the decoder circuit has not been discharged, the driver transistor MT of the output stage is rendered conductive and can switch through a selection signal S2, applied thereto, to the output B of the output stage AS. If, however, the output DC of the decoder circuit DKK has been discharged, the driver transistor MT remains blocked and a selection signal applied thereto does not reach the output B, and consequently does not reach a line LA connected to the output B.

The output stage AS also comprises a shunt transistor MS, whose controlled path is arranged between the output B of the output stage AS and the cut-off transistor AT. The control input of the shunt transistor MS is supplied with the selection signal S2.

At the output B of the output stage there is also arranged an additional transistor MZ, whose controlled path is arranged between the output B of the output stage AS and a fixed potential VSS. The additional transistor MZ is supplied with a timing signal S3 which renders the additional transistor MZ conductive, at least during the time in which the selection signal S2 is not present. Therefore, at least during the time in which the selection signal S2 is not present, the additional transistor MZ determines the potential of the line LA connected to the output B, and in fact establishes this at the voltage VSS.

The output stage AS also contains a coupling capacitor CK which is arranged between the control input and a controlled electrode of the driver transistor MT, and which, on the occurrence of a selection signal S2, in known manner increases the potential at the control input of the driver transistor MT. The cut-off transistor AT is not absolutely necessary, and its function resides in cutting off the load capacitance present at the input of the output stage AS from the output capacitance of the decoder circuit DKK. The fixed potential VDD - UT is applied to the control input of the cut-off transistor.

The function of the decoder circuit illustrated in FIG. 1 will be explained making reference to the pulse plan in FIG. 2. This shows, at the beginning of the pulse trains, the signals S1, S2, S3 and A, and shows the potential at the output DC of the decoder circuit DKK, the potential at the input DN of the driver transistor MT, and the potential at the output B of the output stage AS. On the drawing, n-channel transistors have been used, i.e., these transistors are rendered conductive when a high potential is connected to their control inputs.

First of all the signals S1 and S3 are supplied. When S1 is connected to the pre-charge transistor, the latter is conductive and the output DC of the decoder circuit DKK is charged. Thus the potential at the output DC is likewise high. The timing signal S3 switches the additional transistor MZ into its conductive state, so that the line LA connected to the output B of the output stage AS is connected to a fixed potential, thus here the potential VSS.

Now, the address signals A are connected in unnegated or negated form. That is to say that the control inputs of the decoder transistors DK are offered either a low or a high potential. If one of the decoder transistors DK is offered an address signal having a high potential, the latter is rendered conductive and the output DC of the decoder circuit DKK discharges. This situation is represented in broken lines in FIG. 2. If, however, all the decoder transistors DK are supplied with an address signal having a low potential, these remain blocked and the output DC of the decoder circuit DKK is unable to discharge. This situation is shown in a solid line in FIG. 2. The conditions at the output DC of the decoder circuit DKK are fed via the cut-off transistor AT to the input of the driver transistor MT.

At the time of the occurrence of the selection signal S2, the timing signal S3 is disconnected across the additional transistor MZ. If the output DC of the decoder circuit DKK has been discharged (shown in broken lines), there is no change in the potential at the output B of the output stage AZ and thus on the line LA, because the shunt transistor MS is rendered conductive due to the presence of the selection signal S2, and thus has switched through the potential conditions prevailing at the point DN to the output B of the output stage. If, on the other hand, the output DC of the decoder circuit DKK had not discharged, and thus carries a high potential (shown in a solid line), the driver transistor MT is rendered conductive and the selection signal S2 passes, via the latter, to the output B of the output stage AS. During this procedure, the shunt transistor MS remains blocked and thus is unable to influence the potential at the output B of the output stage. The coupling capacitor CK also produces an increase in the potential at the input of the driver transistor MT.

Shortly prior to the disappearance of the selection signal S2, the timing signal S3 is switched on again and the additional transistor MZ is rendered conductive. In this manner the potential at the ouput B and on the line LA is again established at the potential VSS via the additional transistor MZ. This potential at the output B of the output stage AS also passes via the shunt transistor to the point DN and to the output DC of the decoder circuit DKK, which is therefore discharged again following the selection process of the line LA. All the decoder circuits now possess the same starting potential prior to the next charging process.

When the selection signal S2 has been disconnected, the signal S1 is again supplied to the pre-charge transistor ML, so that the output DC of the decoder circuit DKK can be charged again. Due to the equal starting potentials, all the decoder circuits are charged to the same end potential, as a result of which the pattern sensitivity of the storage module is substantially reduced. Pattern sensitivity is here understood in that the charging process of the decoder circuits was previously based on different potentials in accordance with the previously applied address signal combination, in dependence upon whether a decoder circuit was previously selected during the decoding of the address signals, or not. On the other hand, the decoder circuit corresponding to the invention is always based upon the same potential.

Therefore, the additional transistor ensures that the output B of the output stage AS, and thus also the line LA connected to this output are always determined in respect of potential, regardless of whether this line LA has been selected or not. In this way, capacitive overcouplings or leakage circuits are unable to influence the non-selected line LA.

Although we have described our invention by reference to a particular illustrative embodiment thereof, many changes and modifications may become apparent to those skilled in the art without departing from the spirit and scope of the invention. We therefore intend to include within the patent warranted hereon all such changes and modifications as may reasonably and properly be included within the scope of our contribution to the art.

We claim:

1. A decoder circuit arrangement comprising
a decoder circuit comprising a plurality of parallel-connected MOS transistors having a plurality of inputs for receiving signals to be decoded and a decoder output for emitting a decoded signal,
an output stage including an input connected to said output of said decoder circuit and having an output, and a pair of control signal inputs,
an MOS driver transistor in said output stage including a controlled path connected between one of said control inputs for receiving a selection signal, and said output of said output stage and including a gate connected to said output of said decoder circuit,
a shunt MOS transistor in said output stage including a controlled path connected between said output of said decoder circuit and said output of said output stage and having a gate connected to said one control input, and
an additional MOS transistor in said output stage including a controlled path connected between said output of said output stage and a fixed potential and a gate connected to the other of said control inputs for receiving a timing signal which renders said additional transistor conductive at least during the time in which the selection signal is not present.

2. The decoder circuit arrangement of claim 1, comprising:
means for rendering said timing signal effective to render said additional MOS transistor conductive prior to the occurrence of the trailing edge of said selection signal.

3. The decoder circuit arrangement of claim 1, comprising:
means for discharging the output of said decoder circuit including said shunt MOS transistor connected between said decoder circuit and said additional MOS transistor.

* * * * *